(12) United States Patent
Zhou

(10) Patent No.: US 11,342,922 B1
(45) Date of Patent: May 24, 2022

(54) DIRECT BI-DIRECTIONAL GRAY CODE COUNTER

(71) Applicant: ADVANCED MICRO DEVICES (SHANGHAI) CO., LTD., Shanghai (CN)

(72) Inventor: HaiFeng Zhou, Shanghai (CN)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/129,349

(22) Filed: Dec. 21, 2020

(51) Int. Cl.
*H03K 23/00* (2006.01)
*H03M 7/16* (2006.01)

(52) U.S. Cl.
CPC ............ *H03K 23/005* (2013.01); *H03M 7/16* (2013.01)

(58) Field of Classification Search
None
See application file for complete search history.

(56) References Cited

U.S. PATENT DOCUMENTS

| | | | |
|---|---|---|---|
| 3,020,481 A | 2/1962 | Hulst | |
| 4,780,894 A | 10/1988 | Watkins et al. | |
| 5,045,854 A * | 9/1991 | Windmiller | H03K 21/12 341/97 |
| 5,754,614 A * | 5/1998 | Wingen | H03K 23/005 341/97 |
| 6,314,154 B1 * | 11/2001 | Pontius | H03K 23/005 377/16 |
| 6,703,950 B2 * | 3/2004 | Yi | H03M 7/16 341/159 |
| 6,801,143 B2 | 10/2004 | Oberai et al. | |
| 6,937,172 B1 | 8/2005 | Lowe et al. | |
| 6,970,113 B1 | 11/2005 | Lim et al. | |
| 8,867,694 B1 | 10/2014 | Gupta et al. | |
| 10,439,617 B2 | 10/2019 | Neidengard | |
| 2002/0101526 A1 | 8/2002 | Hamaguchi | |
| 2003/0179848 A1 | 9/2003 | Nakamura | |
| 2004/0113822 A1 * | 6/2004 | Jiang | H03M 7/16 341/98 |
| 2005/0129167 A1 | 6/2005 | Heimbigner | |
| 2005/0258988 A1 * | 11/2005 | Jiang | H03M 7/16 341/97 |
| 2007/0194821 A1 * | 8/2007 | Gomm | H03L 7/089 327/158 |
| 2008/0224904 A1 | 9/2008 | Fujimura | |
| 2015/0024437 A1 | 1/2015 | Furlan et al. | |
| 2017/0324415 A1 | 11/2017 | Neidengard | |
| 2020/0153440 A1 * | 5/2020 | Sakurai | H04N 5/378 |

* cited by examiner

Primary Examiner — Tuan T Lam

(57) ABSTRACT

A bi-directional Gray code counter includes a first set of logic circuitry configured to receive an input having a first sequence of bits representing a first value. The first set of logic circuitry is further configured to convert the first sequence of bits to a second sequence of bits representing the first value. The bi-directional Gray code counter further includes a second set of logic circuitry and third second set of logic circuitry. The second set of logic circuitry is configured to compare the second sequence of bits to a bit index pattern. The third set of logic circuitry is configured to transition one bit in the first sequence of bits from a first state to a second state to form a third sequence of bits representing a second value. The one bit is transitioned in response to the second sequence of bits being compared to the bit index pattern.

24 Claims, 8 Drawing Sheets

600

```
1   //Conversion of Gray code to equivalent binary code
2   genvar bin_gen;
3   generate
4   for (bin_gen=0; bin_gen<P_AW; bin_gen=bin_gen+1) begin: bin_data_gen
5     assign bin[bin_gen] = (^gray_in[P_AW-1   :bin_gen]) ^(inc);
6   end
7   endgenerate
8
9   //Find the transition index (which bit to be inverted next) based on the equivalent binary code.
10  //Bit 0 toggle when bin[0] ==0;
11  assign bin_idx[0] = !bin[0];
12
13  //For other bits  i, the polarity changes only when   $B_i B_{i-1} B_{i-2} ... B_0$ = 011 ... 1.
14  genvar bin_idx_gen;
15  generate
16  for (bin_idx_gen=1; bin_idx_gen<P_AW-1; bin_idx_gen=bin_idx_gen+1) begin: bin_idx_gen_gen
17    assign bin_idx[bin_idx_gen] =  (!bin[bin_idx_gen] & (&bin[bin_idx_gen-1:0]));
18  end
19  endgenerate
20
21  //For the MSB bit, the circuit is different.
22  assign bin_idx[P_AW-1] = &bin[P_AW-2:0];
23
24  //gray_out[i] = bin_idx[i]? !gray_in[i]: gray_in[i];
25  //Use an XOR gate to replace the mux such that gray_out[i] = bin_idx[i] ^ gray_in[i];
26  genvar bit_idx;
27  generate
28  for (bit_idx=0; bit_idx<P_AW; bit_idx=bit_idx+1) begin: gen_reg
29    always @ (posedge clk or negedge rst_n)
30    if (!rst_n)
31      gray_out[bit_idx] <= 1'b0;
32    else
33      gray_out[bit_idx] <= bin_idx[bit_idx] ^ gray_in[bit_idx];
34  end
35  endgenerate
```

FIG. 6

DIRECT BI-DIRECTIONAL GRAY CODE COUNTER

BACKGROUND

Binary counters are used extensively in the design of processors and other digital systems. Binary counters are typically formed from logic circuitry having multiple binary stages. The output of each binary stage changes state in response to input pulses received at the counter according to a binary code representing numerical values between 0 and $2^{N-1}$. As such, a digital binary counter can be used to generate a binary code corresponding to a count of the number of input pulses received at the counter over a predetermined interval.

One example of an electrical binary counter is a serial binary counter capable of generating natural binary code. A serial binary counter counts up or down in accordance with normal binary sequences. However, adjacent numbers in the normal binary sequence often differ in multiple bits. Therefore, a large number of bits can simultaneously transition when counting. The simultaneous transitioning of multiple bits increases the risk of transition errors and also increases electrical noise generated by the logical circuitry.

In an effort to overcome the issues caused by serial binary counters when a relatively large number of bits transition simultaneously, Gray code counters are often used in place of serial binary counters. A Gray code is an ordered sequence of binary integers having only a one-bit difference between adjacent integers in the sequence. Stated differently, only one of the binary stages of a Gray code counter can change state at a time for each counter input pulse. As such, Gray code counters decrease the risk of transition errors and electrical noise generated by serial binary counters.

SUMMARY OF EMBODIMENTS

In accordance with one aspect, a method includes converting a first sequence of bits to a second sequence of bits representing. The method further includes comparing the second sequence of bits to a bit index pattern. Responsive to comparing the second sequence of bits to the bit index pattern, the first sequence of bits is converted to a second sequence of bits representing. Converting the first sequence of bits to the second sequence of bits, in at least some embodiments, includes inverting the second sequence of bits responsive to determining that the first value is to be decremented. In at least some embodiments, the first sequence of bits is received as an input and represents a first value. The second sequence of bits, in at least some embodiments, also represents the first value. In at least some embodiments, the first sequence of bits includes a Gray code format, and the second sequence of bits includes a binary code format equivalent to the Gray code format. The method further includes comparing the second sequence of bits to a bit index pattern. Responsive to comparing the second sequence of bits to the bit index pattern, one bit in the first sequence of bits is transitioned from a first state to a second state to form a third sequence of bits representing. In at least some embodiments, the third sequence of bits represents a second value. An output including the third sequence of bits is generated.

In at least some embodiments, comparing the second sequence of bits to the bit index includes determining whether a pattern of bits in the second sequence of bits matches the bit index pattern. Responsive to a pattern of bits matching the bit index pattern, a most significant bit of the pattern of bits is selected as a bit index. A bit in the first sequence of bits having a bit position corresponding to a bit position of the bit index is selected as the one bit that is transitioned from the first state to the second state. Responsive to no pattern of bits in the second sequence of bits matching the bit index pattern, a determination is made whether the least significant bit of the second sequence of bits has a zero-value or at least all less significant bits of the second sequence of bits have a one-value. Responsive to the least significant bit having a zero-value, the least significant bit is selected as the bit index. Responsive to at least all less significant bits having a one-value, the most significant bit of the second sequence of bits is selected as the bit index.

In accordance with another aspect, a processing unit includes a bi-directional Gray code counter. The bi-directional Gray code counter includes a first set of logic circuitry to convert the first sequence of bits to a second sequence of bits. In at least some embodiments, the first sequence of bits is received as an input and represents a first value. The second sequence of bits, in at least some embodiments, also represents the first value. Converting the first sequence of bits to the second sequence of bits, in at least some embodiments, includes the first set of logic circuitry inverting the second sequence of bits responsive to determining that the first value is to be decremented. In at least some embodiments, the first sequence of bits includes a Gray code format, and the second sequence of bits includes a binary code format equivalent to the Gray code format. The bi-directional Gray code counter further includes a second set of logic circuitry and a third set of logic circuitry. The second set of logic circuitry is to compare the second sequence of bits to a bit index pattern. The third set of logic circuitry is to transition one bit in the first sequence of bits from a first state to a second state to form a third sequence of bits responsive to the second set of logic circuitry comparing the second sequence of bits to the bit index pattern. In at least some embodiments, the third sequence of bits represents a second value. The third set of logic circuitry further generates an output including the third sequence of bits.

In at least some embodiments, the second set of logic circuitry compares the second sequence of bits to the bit index by determining whether a pattern of bits in the second sequence of bits matches the bit index pattern. Responsive to a pattern of bits matching the bit index pattern, the second set of logic circuitry selects a most significant bit of the pattern of bits as a bit index. The second set of logic circuitry is further to select a bit in the first sequence of bits having a bit position corresponding to a bit position of the bit index as the one bit that is transitioned from the first state to the second state. Responsive to no pattern of bits in the second sequence of bits matching the bit index pattern, the second set of logic circuitry is further to determine whether the least significant bit of the second sequence of bits has a zero-value or at least all less significant bits of the second sequence of bits have a one-value. Responsive to the least significant bit having a zero-value, the second set of logic circuitry is further to select the least significant bit as the bit index. Responsive to at least all less significant bits having a one-value, the second set of logic circuitry is further to select the most significant bit of the second sequence of bits as the bit index.

In accordance with yet another aspect, a bi-directional Gray code counter includes a first set of logic circuitry to convert the first sequence of bits to a second sequence of bits. In at least some embodiments, the first sequence of bits is received as an input and represents a first value. The second sequence of bits, in at least some embodiments, also represents the first value. Converting the first sequence of bits to the second sequence of bits, in at least some embodiments, includes the first set of logic circuitry inverting the second sequence of bits responsive to determining that the first value is to be decremented. In at least some embodiments, the first sequence of bits includes a Gray code format, and the second sequence of bits includes a binary code format equivalent to the Gray code format. The bi-directional Gray code counter further includes a second set of logic circuitry and a third set of logic circuitry. The second set of logic circuitry is to compare the second sequence of bits to a bit index pattern. The third set of logic circuitry is to transition one bit in the first sequence of bits from a first state to a second state to form a third sequence of bits responsive to the second set of logic circuitry comparing the second sequence of bits to the bit index pattern. In at least some embodiments, the third sequence of bits represents a second value. The third set of logic circuitry further generates an output including the third sequence of bits.

In at least some embodiments, the second set of logic circuitry compares the second sequence of bits to the bit index includes by determining whether a pattern of bits in the second sequence of bits matches the bit index pattern. Responsive to a pattern of bits matching the bit index pattern, the second set of logic circuitry selects a most significant bit of the pattern of bits as a bit index. The second set of logic circuitry is further to select a bit in the first sequence of bits having a bit position corresponding to a bit position of the bit index as the one bit that is transitioned from the first state to the second state. Responsive to no pattern of bits in the second sequence of bits matching the bit index pattern, the second set of logic circuitry is further to determine whether the least significant bit of the second sequence of bits has a zero-value or at least all less significant bits of the second sequence of bits have a one-value. Responsive to the least significant bit having a zero-value, the second set of logic circuitry is further to select the least significant bit as the bit index. Responsive to at least all less significant bits having a one-value, the second set of logic circuitry is further to select the most significant bit of the second sequence of bits as the bit index.

BRIEF DESCRIPTION OF THE DRAWINGS

The present disclosure is better understood, and its numerous features and advantages made apparent to those skilled in the art, by referencing the accompanying drawings. The use of the same reference symbols in different drawings indicates similar or identical items.

FIG. 6 is a listing of an example hardware description language (HDL) code describing the circuit design of FIGS. 4 and 5 in accordance with some embodiments.

DETAILED DESCRIPTION

Figure 1:
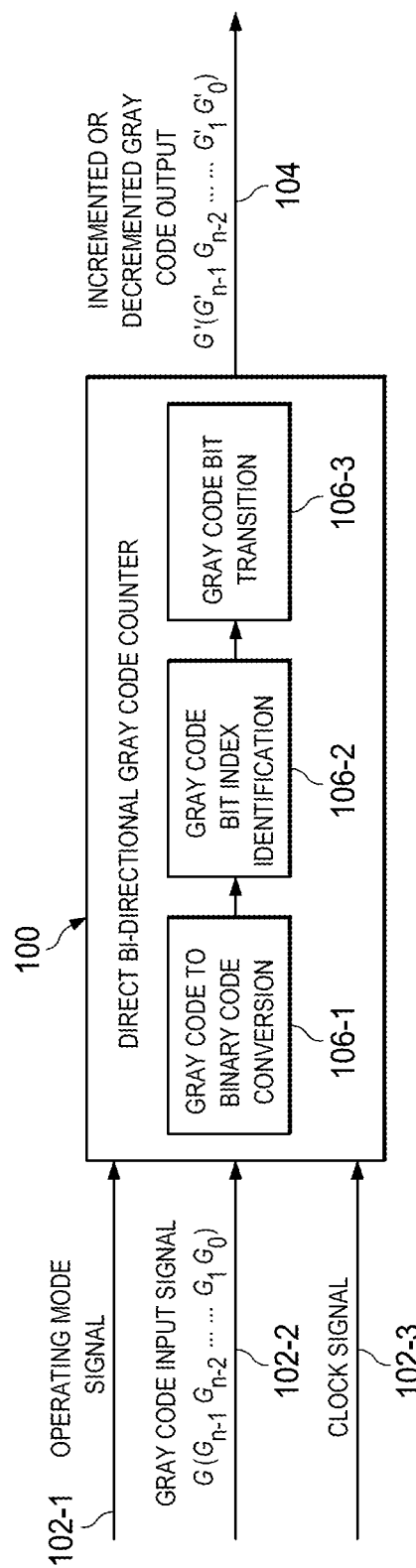
FIG. 1 is a block diagram of a bi-directional Gray code counter in accordance with some embodiments.

Gray code is an ordering of the binary numeral system such that two successive values differ by only one bit (binary digit). Gray code originated at a time when digital logic circuits were built from vacuum tubes and relays, resulting in conventional counters generating enormous power demands and noise spikes when many bits changed simultaneously. Gray code overcame these power and noise issues since any increment or decrement in a Gray code value only changes one bit regardless of the number size. As such, Gray code counters minimized the effect of noise resulting from multiple bits transitioning simultaneously. These same benefits continue to apply in modern transistor-based processors and other digital systems.

However, due to the complexity involved in counting Gray code, conventional bi-directional gray code counters typically convert the Gray code into binary code and then increment or decrement the binary code. The incrementing/decrementing of the binary code and conversion of the binary code back into Gray code adds unnecessary complexity to Gray code counter by requiring additional logic gates to be added to the design for accomplishing these operations. Increasing the number of logic gates not only causes undesirable propagation delays with resultant degradation in performance but also increases the surface area of the chip required to implement the counter.

The present disclosure describes embodiments of systems and methods for directly incrementing or decrementing a Gray code value that overcome various problems associated with conventional Gray code counters. As described in greater detail below, a bi-directional Gray code counter directly increments or decrements a Gray code value without requiring the binary code equivalent of the Gray code value to be incremented or decremented and then converted back into an incremented/decremented Gray code value. Directly incrementing/decrementing a Gray code value allows for improvements in at least chip area, timing, and power requirements of devices implementing embodiments of the present disclosure over conventional devices.

Although various types of Gray code have been developed, including reflected binary code, binary reflected Gray code, balanced Gray code, and two-dimensional Gray code, the reflected binary code (RBC) variant of Gray code is used throughout this disclosure as an example of a Gray code applicable to at least some embodiments. As such, the terms "Gray code", "Gray code value", "Gray code sequence", and their variants used herein refer to the reflected binary code (RBC) variant of Gray code, where the first (N/2, N=2') values compare with those of the last (N/2) values but in reverse order. However, one or more other variants of Gray code may be applicable as well. Also, it should be understood that an n-bit vector of binary data is represented herein as $B(B_{n-1}B_{n-2} \ldots B_1B_0)$ and an n-bit vector of Gray code is represented herein as $G(G_{n-1} G_{n-2} \ldots G_1G_0)$, where the right-most/lowest bit is bit-0.

It should also be understood, as used herein, the terms "logical one" and "high state" refer to a high logical state, which may include a digital value of one, a specified voltage or voltage range, and/or any other value understood to constitute a logical one or logical high state in logic circuitry. The terms "logical zero" and "low state" refer to a logical low state, which may include a digital value of zero, 0 volts, ground, and/or any other value understood to constitute a logical zero or logical low state in logic circuitry. Additionally, in at least some embodiments, the operations and/or features associated with a "logical one"

and/or "logical high state" can be transposed with the operations and/or features associated with a "logical zero" and/or "logical low state" and vice versa.

An n-bit Gray code can be generated recursively from a list of n−1 bits using a reflect and prefix method where the entries are listed in reverse order, and the entries in the original list are prefixed with a binary 1. The original list is concatenated with the reversed list to obtain the Gray code. For example, generating the n=2 list from the n=1 list of [0, 1] involves reflecting [0, 1] to obtain a new list [1, 0]. The old list [0, 1] is prefixed with a binary 0 to obtain a first prefixed list [00, 01]. The new list [1, 0] is prefixed with a binary 1 to obtain a second prefixed list [11, 10]. The first prefixed list [00, 01] is concatenated with the second prefixed list [11, 10] to obtain a 2-bit Gray code of (00, 01, 11, 10). As such, Gray code 0 and 1 are equivalent to Binary number 0 and 1, respectively, and Gray codes 00, 01, 11, and 10 are equivalent to Binary numbers 00, 01, 10, and 11, respectively. As the reflect and prefix method is continued for an increasing n value, a first observation can be made that RBC Gray code is a one-to-one function $G_i$ of the integers 0 to $2^i-1$ such that each bit of $G_i$ and $G_{i+1}$ differ in exactly one bit. A second observation can be made that Gray code has a cyclic property such that when cycling around from the last entry (most significant bit (MSB)) to the first entry (least significant bit (LSB)) only one-bit changes.

Conversion of a binary code value to a Gray code value can be represented by the following equation:

$$G_{i-1} = B_i \oplus B_{i-1} \quad \text{(EQ 1)}.$$

Accordingly, $G_{i-1}=1$ only when $B_i \oplus B_{i-1}$. As such, the conversion from a Gray code value to a binary code value can then be represented based on EQ 1 as follows:

$$B_i | B_{i-1} = G_{i-1} \quad \text{(EQ 2)},$$

$$B_i \oplus B_{i-1} \oplus B_i = G_{i-1} \oplus B_i \quad \text{(EQ 3)}.$$

Then, $$B_{i-1} = G_{i-1} \oplus B_i \quad \text{(EQ 4)}.$$

After a recursive operation:

$$B_{i-1} = G_{n-1} \oplus G_{n-2} \oplus \ldots \oplus G_{i-1} \quad \text{(EQ 5)}.$$

Especially, for $B_0$:

$$B_0 = G_{n-1} \oplus G_{n-2} \oplus \ldots \oplus G_0 \quad \text{(EQ 6)}.$$

EQ 5 shows that $B_{i-1}$ is the Parity checksum of the more significant bits of $G_{n-1} \oplus G_{n-2} \oplus \ldots \oplus G_{i-1}$ and EQ 6 shows that $B_0$ is the Parity checksum of the Gray code $G_{n-1} \oplus G_{n-2} \oplus \ldots \oplus G_0$. When going up from B to B+1 exactly one bit of G changes. Therefore, exactly two bits change in going from B to B+2. Thus, the number of bits that are 1 remains the same or changes by 2, i.e., the parity remains the same.

A Gray code counter, of at least some embodiments, can be understood by first considering binary code counters. Binary code counters have the following two properties: (P1) for a binary up counter, bit $B_i$ transits from 0 to 1 iff (if and only if) all its less significant bits are all 1, and (P2) for a binary code down counter, bit $B_i$ transits from 1 to 0 iff its less significant bits are all 0. As such, for a binary code up counter, according to property P1, $B_i$ toggles when its less significant bits are all 1. All the less significant bits will toggle to 0 simultaneously. Also, for a binary code down counter, according to property P2, $B_i$ toggles when the less significant bits are all 0. All the less significant bits will toggle to 1 simultaneously. As such, for a binary up/down code counter, if $B_i$ changes, all its less significant bits $B_{i-1} B_{i-2} \ldots B_0$ will change simultaneously.

Moreover, for a binary code up counter, bit $B_i$ transits to 1 from 0 if the carry from the less significant bits is 1. This transit only occurs when the less significant bits $B_{i-1} B_{i-2} \ldots B_0$ are all 1. The carry bit cannot be propagated to the more significant bits $B_1$ (j>i) because no carry bit is generated on the current bit ($B_i=0$) increment operation. As such, for a binary code up counter, $B_i$ transits to 1 from 0 iff $B_i$ is the least significant 0 within B. All the less significant bits $B_{i-1} B_{i-2} \ldots B_0$ change from 1 to 0, and for other more significant bits $B_j$(j>i), no transition occurs. For a binary code down counter, bit $B_i$ transits to 0 from 1 if the carry from the less significant bits is 1. This transit only occurs when the less significant bits $B_{i-1} B_{i-2} \ldots B_0$ are all 0. The carry bit cannot be propagated to the more significant bits $B_j$ (j>i) because no carry bit is generated on the current bit ($B_i=1$) decrement operation. As such, for a binary down counter, $B_i$ transits to 0 from 1 iff $B_i$ is the least significant 1 within B. All the less significant bits $B_{i-1} B_{i-2} \ldots B_0$ change from 0 to 1, and For other more significant bits $B_j$ (j>i), no transition occurs.

Considering EQ 1 and property P1 of binary code counters, a Gray code counter, in at least some embodiments, comprises the following characteristics: (1) for a Gray code up counter, $G_i$ changes polarity iff the corresponding $B_i$ is 0 and its less significant bits $B_{i-1} B_{i-2} \ldots B_0$ are all 1, i.e. $B_i B_{i-1} B_{i-2} \ldots B_0 = 011 \ldots 1$, and (2) for a Gray code down counter, $G_i$ changes polarity iff the corresponding $B_i$ is 1 and the less significant bits $B_{i-1} B_{i-2} \ldots B_0$ are all 0, i.e. $B_i B_{i-1} B_{i-2} \ldots B_0 = 100 \ldots 0$. In more detail, according to EQ 1, $G_i = B_{i+1} \oplus B_i$, $G_i$ polarity change only occurs when $B_{i+1}$ and $B_i$ change non-simultaneously. Since any bit changes in a binary code counter results in all less significant bits changing, $G_i$ polarity change only occurs when $B_i$ changes while $B_{i+1}$ does not change. Also, such $G_i$ change only occurs when $B_i$ changes from 0 to 1 for an up counter because $B_{i+1}$ will also change if $B_i=1$. According to the characteristics and properties described above for a binary counter, the less significant bits of $B_{i-1} B_{i-2} \ldots B_0$ should be all 1. Similarly, for a down counter, $G_i$ change only occurs when $B_i$ changes from 1 to 0 because $B_{i+1}$ will also change if $B_i=0$. According to the characteristics described above for a binary counter, the less significant bits of $B_{i-1} B_{i-2} \ldots B_0$ should be all 0.

As such, based on the characteristics and properties of a Gray code counter described above, the necessary condition for $G_i$ to change its polarity, in at least some embodiments, is that the less significant bits of the equivalent Binary code is either 011 . . . 1 or 100 . . . 0. Based on the EQ 1 ($G_{i-1} = B_i \oplus B_{i-1}$), the Gray code for 011 . . . 1 and 100 . . . 0 can be respectively calculated as:

$$\begin{array}{cccccccc}
B_i & B_{i-1} & B_{i-2} & B_{i-3} & & B_1 & B_0 \\
0 & 1 & 1 & 1 & \ldots & \ldots 1 & 1 \\
 & \oplus & \oplus & \oplus & & \oplus & \oplus \\
\hline
= G_i & 1 & 0 & 0 & \ldots & \ldots 0 & 0 \\
\\
1 & 0 & 0 & 0 & \ldots & \ldots 0 & 0 \\
 & \oplus & \oplus & \oplus & & \oplus & \oplus \\
\hline
= G_i & 1 & 0 & 0 & \ldots & \ldots 0 & 0.
\end{array}$$

Accordingly, the corresponding less significant Gray code are both 100 . . . 0. As such, in at least some embodiments, another characteristic (3) of the Gray code counter 100 is that $G_i$ changes polarity only when the adjacent less significant bit is 1 and all other less significant bits are all 0, i.e. $G_{i-1} G_{i-2} \ldots G_1 G_0 = 100 \ldots 0$.

FIG. 1 illustrates a bi-directional Gray code counter 100 (also referred to herein as "counter 100") for directly incrementing or decrementing Gray code values in accordance with at least some embodiments. In the example shown in FIG. 1, the counter 100 receives a plurality of input signals 102 and generates one or more output signals 104 comprising an incremented or decremented Gray code value. In at least some embodiments, the counter 100 further comprises one or more operational stages 106 for generating the incremented or decremented Gray code value. The plurality of input signals 102, in at least some embodiments, include an operating mode signal 102-1, a Gray code input signal 102-2, and a clock signal 102-3. The operating mode signal 102-1 places the counter 100 in a first operating mode, such as an incrementing mode, or a second operating mode, such as a decrementing mode. In at least some embodiments, the counter 100 enters into the first operating mode responsive to the operation mode signal 102-1 having a logical low state and is triggered to enter into the second operating mode responsive to the operating mode signal 102-1 having a logical high state, or vice versa.

The Gray code input signal 102-2, in at least some embodiments, comprises a sequence of n-bits $(G_{n-1} G_{n-2} \ldots G_1 G_0)$ representing a Gray code value G. The counter 100 determines whether the Gray code value G is to be incremented or decremented based on the operating mode signal 102-1 and increments or decrements the Gray code value G utilizing the operational stages 106. The operational stages 106 include, in at least some embodiments, a first operational stage 106-1, a second operational stage 106-2, and a third operational stage 106-3. During the first operational stage 106-1, the counter 100 converts the Gray code value G into an equivalent binary code value B represented by a corresponding sequence of n-bits $(B_{n-1} B_{n-2} B_1 B_0)$. During the second operational stage 106-2, the counter compares the sequence of binary code bits $(B_{n-1} B_{n-2} \ldots B_1 B_0)$ to a specified bit index pattern. The counter 100 determines a bit index from the sequence of binary code bits based on the bit index pattern comparison. The bit index indicates a bit position in the sequence of Gray code bits $(G_{n-1} G_{n-2} \ldots G_1 G_0)$ to transition for incrementing or decrementing the input Gray code vale G. During the third operational stage 106-3, the counter 100 identifies a bit in the sequence of Gray code bits that has the bit position indicated by the bit index and then transitions the current value of the identified bit to a new value. For example, if the current value of the identified Gray code bit is 0, the current value is transitioned to 1. In another example, if the current value of the identified Gray code bit is 1, the current value is transitioned to 0. The counter 100 utilizes the clock signal 102-3 to generate one or more output signals 104 comprising a sequence of n-bits $(G'_{n-1} G'_{n-2} \ldots G'_1 G'_0)$ representing an incremented or decremented Gray code value G'. The counter 100 and each of the operational stages 106 are discussed in greater detail below with respect to FIGS. 2 and 3.

Figure 2:
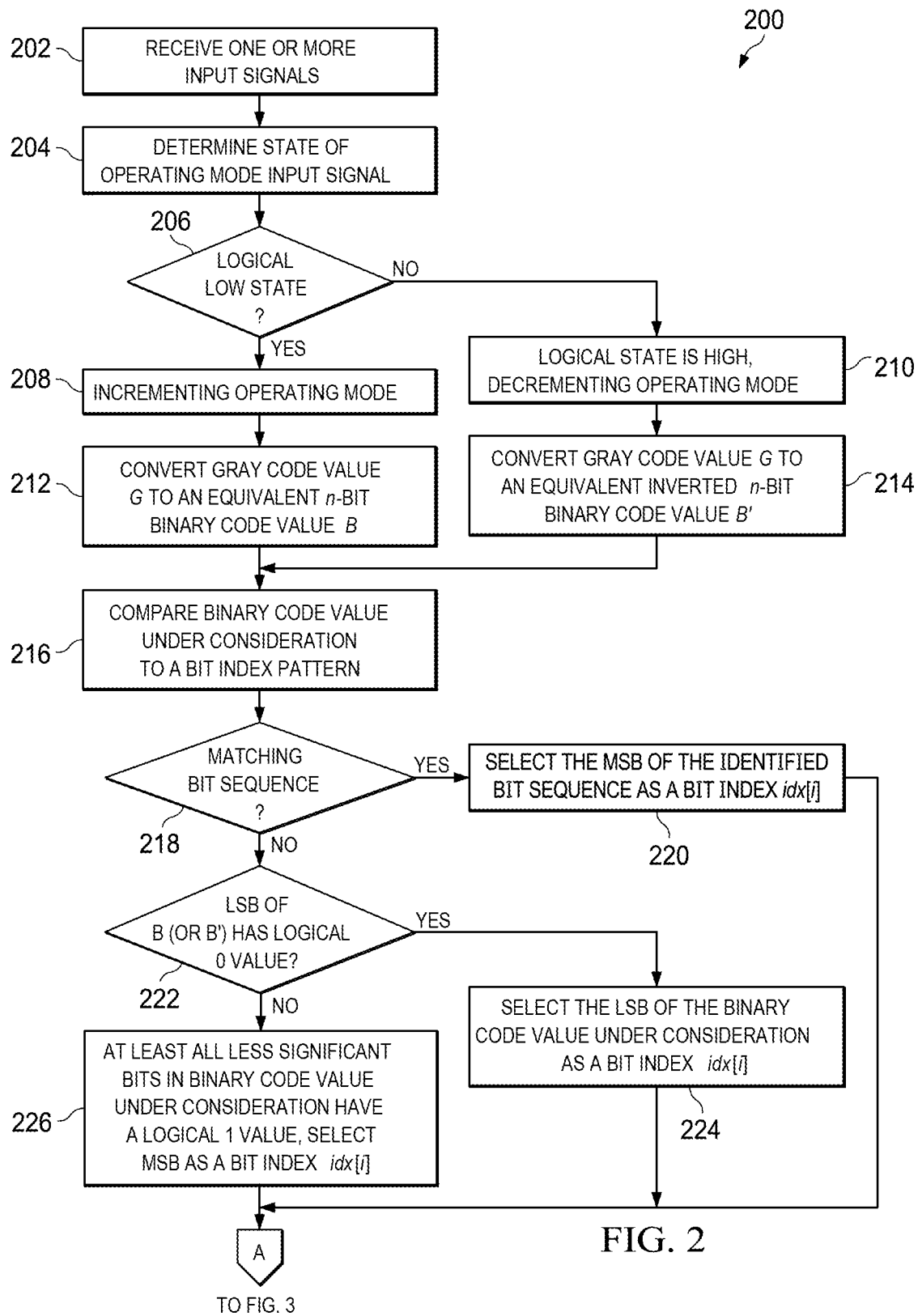
FIGS. 2 and 3 are a flow diagram illustrating a method for directly incrementing or decrementing a Gray code value in accordance with some embodiments.
Figure 3:
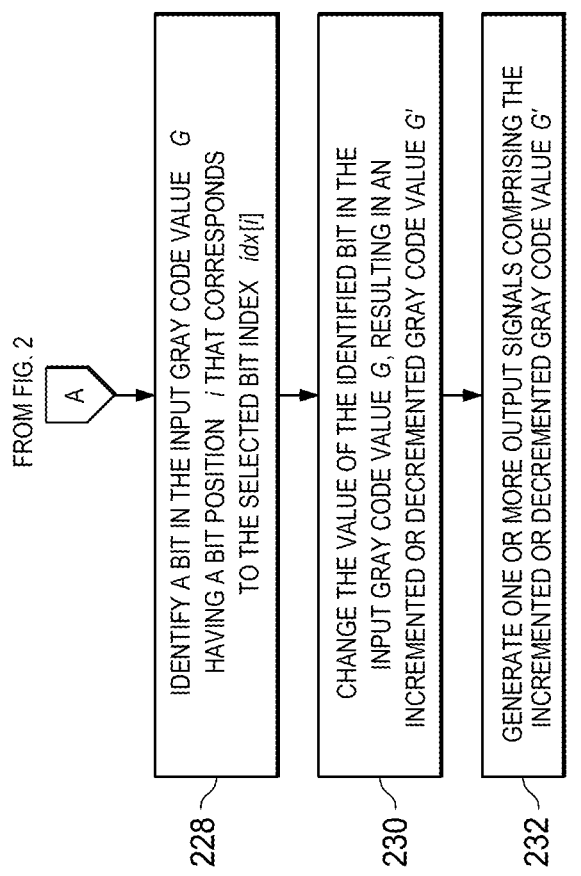

FIGS. 2 and 3 together illustrate an example method 200 of operation of the bi-directional counter 100 for directly incrementing or decrementing a Gray code value in accordance with some embodiments. Method 200 is initiated at block 202 of FIG. 2 in response to the counter 100 receiving one or more input signals 102. The one or more input signals include 102 at least an operating mode signal 102-1, a Gray code value signal(s) 102-2, and at least one clock signal 102-3. The input signals 102 can be received at different times, or two or more of the input signals 102 can be received concurrently. The Gray code value signal(s) 102-2 comprises a sequence of n-bits $(G_{n-1} G_{n-2} \ldots G_1 G_0)$ representing a Gray code value G and can be received from any data source capable of generating Gray code.

In at least some embodiments, the counter 100 at block 204 determines a state of the operating mode signal 102-1 during the first operational stage 106-1. For example, the counter 100 at block 206 determines if the state of the operating mode signal 102-1 is a logical low state or a logical high state. Responsive to the operating mode signal 102-1 being in a logical low state, the counter 100 at block 208 enters into an incrementing operating mode. Responsive to the operating mode signal 102-1 being in a logical high state, the counter 100 at block 210 enters into a decrementing operating mode. It should be understood that, in at least some embodiments, the counter 100 can be configured only as an incrementer or a decrementer. In these embodiments, an enable signal may be received by the counter 100 instead of the operating mode signal 102-1 to enable or disable the counter 100.

When the counter 100 is in an incrementing mode, the counter 100 at block 212 converts the Gray code value G to an equivalent n-bit binary code value B. For example, if the counter 100 receives an 8-bit Gray code value G (00000010) representing decimal 3, the counter converts the Gray code value G (00000010) to the equivalent 8-bit binary code value B of (00000011). However, when the counter 100 is in a decrementing mode, the counter 100 at block 214, converts the Gray code value G to an equivalent inverted n-bit binary code value B' during the first operational stage 106-1. For example, if the counter 100 receives the 8-bit Gray code value G (00000010) and the equivalent 8-bit binary code value B is (00000011), the counter 100 converts the 8-bit Gray code value G (00000010) to the inverted 8-bit binary code value B' of (1111111100). An advantage of converting the Gray code value G to the inverted 8-bit binary code value B' is that the same bit index pattern (described below) can be used for both the incrementing mode and the decrementing mode, thereby avoiding the need for separate one-way counters or separate logic circuitry to be implemented in the counter 100 for each operating mode.

After the Gray code value G has been converted to the equivalent binary code value B or B', the counter 100 at block 216 enters the second operational stage 106-2 and compares the binary code value B or B' to a bit index pattern. In at least some embodiments, the bit index pattern for the incrementing and decrementing operating modes is (01 . . . 1), where the MSB bit of the pattern has a value of 0 and each of the less significant bits has a value of 1. If the equivalent binary code value was not inverted for the decrementing mode, the bit index pattern, in at least some embodiments, is (10 . . . 0) where the MSB bit of the pattern has a value of 1, and each of the less significant bits has a value of 0. The counter 100 at block 218 determines whether a bit sequence in the binary code value under consideration (B or B') matches the bit index pattern. Responsive to the binary code value under consideration (B or B') comprising a bit sequence matching the bit index pattern, the counter 100 at block 220 selects the MSB of the identified bit sequence as a bit index idx[i] for incrementing or decrementing the Gray code value G, where i is the bit position of the selected bit. For example, if the binary code value B under consideration is (00000011), the counter 100 determines the bit sequence of (011) in bit positions $(B_2, B_1, B_0)$ matches the bit index pattern (01 . . . 1). Therefore, the counter 100 selects $B_2$, which is the MSB of the sequence of (011) in this example, as the bit index idx[2] for incrementing the Gray code vale G. The flow then continues to block 228 of FIG. 3.

However, if the counter 100 at block 218 determines that the binary code value B or B' does not comprise a bit sequence matching the bit index pattern, the counter 100 determines that either the LSB or the MSB of the sequence representing the binary code value B or B' is to be selected as the bit index idx[i]. For example, the counter 100 at block 222 determines whether the least significant bit (LSB) of the binary code value B or B' has a logical low value (e.g., 0). Responsive to the LSB of the binary code value B or B' having a low logic value, the counter 100 at block 224 selects the LSB as the bit index idx[0] and the control flows to block 228 of FIG. 3. Responsive to the LSB not having a low logic value (e.g., the LSB has a value of 1), the counter 100 at block 226 determines that at least all less significant bits of the binary code B or B' have a high logic value (e.g., 1) and selects the MSB of the 8-bit binary code value B or B' as the bit index idx[7]. The control then flows to block 228 of FIG. 3. It should be understood that the counter 100 can perform the operations at blocks 222 to 226 prior to the operations of block 216. For example, prior to comparing the bit sequence of the binary code value B or B' to the bit index idx[i], the counter 100 can first determine whether the LSB of the bit sequence has a low logic value or if all bits in the bit sequence have a high logic value.

After selection of the bit index idx[i], the counter 100 at block 228 (FIG. 3) enters the third operational stage 106-3 and identifies a bit in the input Gray code bit sequence ($G_{n-1}G_{n-2} \ldots G_1G_0$) having a bit position i that corresponds to the selected bit index idx[i]. The counter 100 at block 230 changes the value of the identified bit in the input Gray code bit sequence, resulting in an incremented or decremented Gray code value G'. If the bit in the input Gray code bit sequence is selected based on a bit index idx[i] determined from the binary code value B, then the Gray code value G is incremented. For example, if the Gray code value G has the bit sequence (00000010) representing decimal 3 and the bit index is 042], bit number 2 is changed from 0 to 1 resulting in an incremented Gray code value G' of (00000110), which is equivalent to decimal 4. However, if the Gray code value G has the bit sequence (00000110) representing decimal 4 and the bit index is idx[2], bit number 2 is changed from 1 to 0 resulting in a decremented Gray code value G' of (00000010), which is equivalent to decimal 3. In at least some embodiments, the counter 100 changes the value of the identified bit by changing the logical state of the bit from either high to low or low to high. The counter 100, at block 232, utilizes the input clock signal 102-3 to generate one or more output signals 104 comprising the incremented or decremented Gray code value G'.

Figure 4:
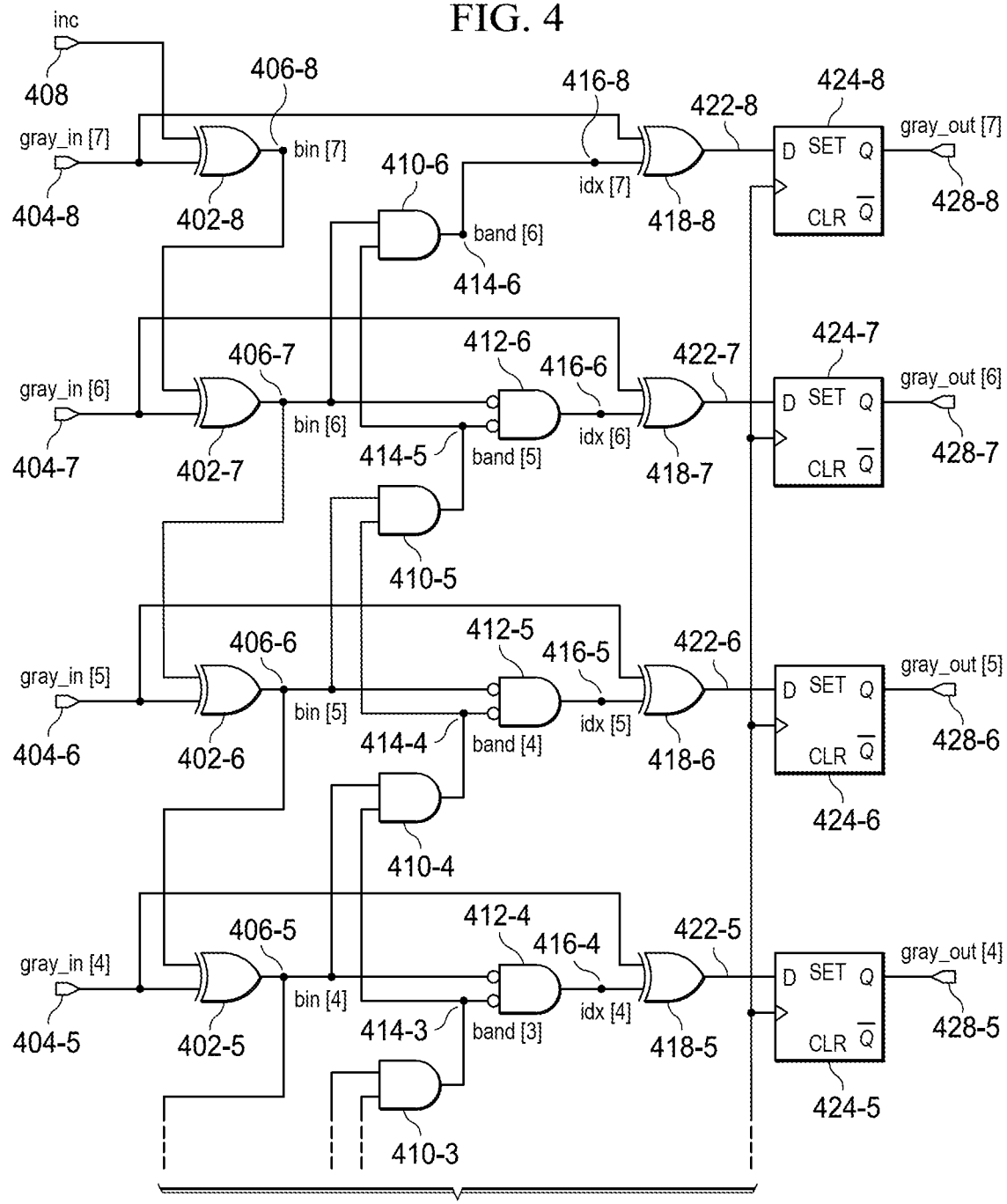
FIGS. 4 and 5 are a diagram illustrating an example of a bi-directional Gray code counter circuit design in accordance with some embodiments.
Figure 5:
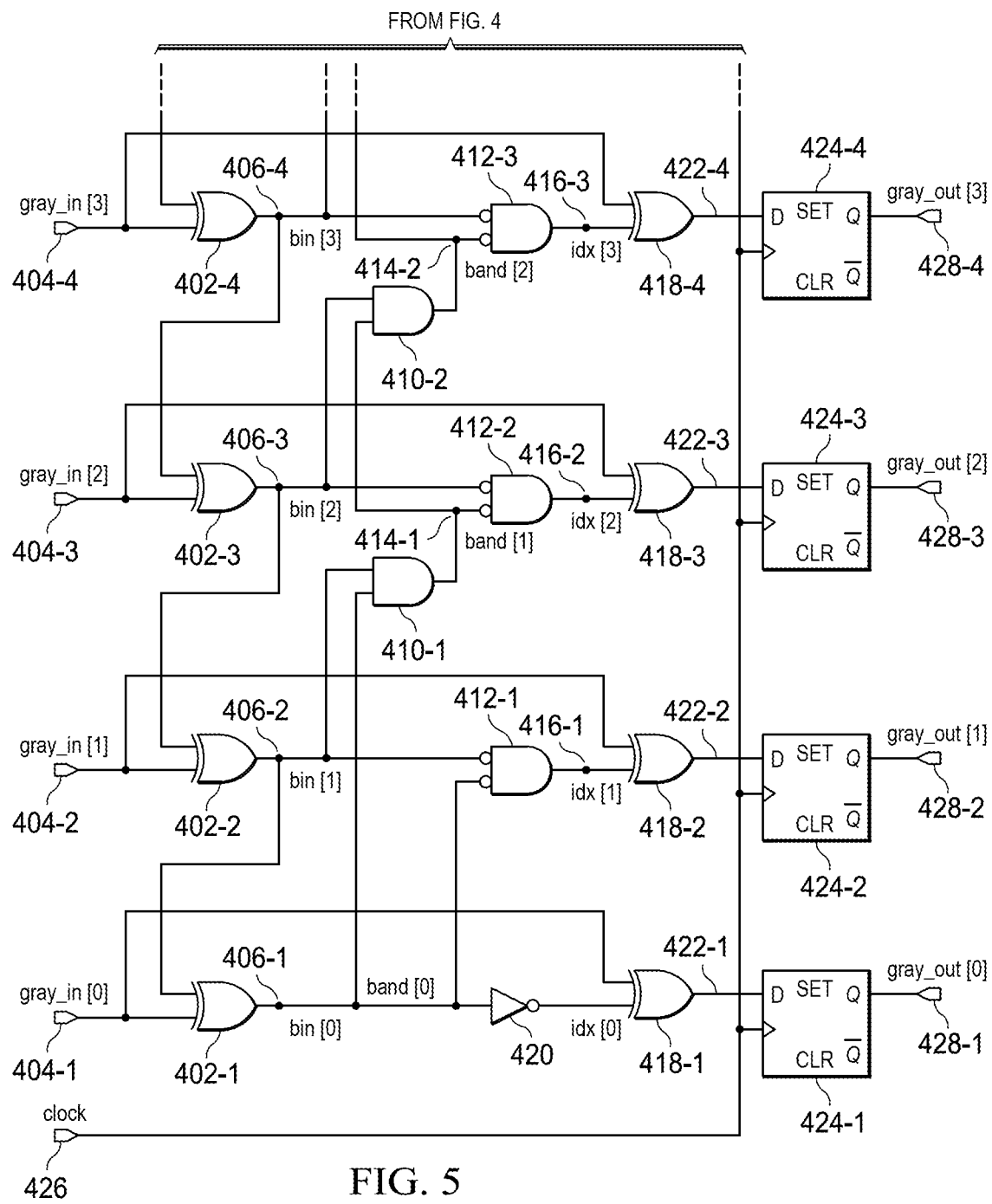

FIGS. 4 and 5 together depict an example of a circuit design 400 for implementing the bi-directional Gray code counter 100 of FIG. 1. Although this depicted example of the circuit design 400 represents an 8-bit bi-directional Gray code, it should be understood that the design 400 is scalable for processing a Gray code input and generating a Gray code output, each having less than or greater than 8-bits. In at least some embodiments, the circuit design 400 comprises a first plurality of XOR gates 402 for converting an input sequence of Gray code bits ($G_{n-1}G_{n-2} \ldots G_1G_0$) 404, representing a Gray code value G, into an equivalent sequence of binary code bits ($B_{n-1}B_{n-2} \ldots B_1B_0$) 406, representing an equivalent binary code value B. The first plurality of XOR gates 402, which comprises chained XOR gates 402, corresponds to the first operational stage 106-1 of the counter 100 discussed above with respect to FIG. 1 and FIGS. 2 and 3.

In at least some embodiments, a first input of each XOR gate 402 receives a separate bit (gray_in[i]) 404 from the sequence of Gray code bits ($G_{n-1}G_{n-2} \ldots G_1G_0$) representing the Gray code value G to be incremented or decremented. In at least some embodiments, the chain of XOR gates 402 is configured such that the first XOR gate 402-1, which is located on the bottom of the XOR chain in FIG. 5, receives the LSB 404-1 of the input Gray code bit sequence 404 and the last XOR gate 402-8, which is located at the top of the XOR chain in FIG. 4, receives the MSB 404-8 of the input Gray code bit sequence 404.

A second input of each XOR gate 402, except for the last XOR gate 402-8, receives the output 406 (bin[i]) of the next XOR gate 402 in the chain. For example, the second input of the first XOR gate 402-1 receives the output 406-2 of the next XOR gate 402-2 in the XOR chain. As such, in at least some embodiments, the output 406 of each XOR gate 402, except for the last XOR gate 402-8, is a high logic or low logic value generated based on an Exclusive-OR operation of the input Gray code bit sequence 404 and the output 406 of the next XOR gate 402 in the XOR chain. In at least some embodiment, the second input of the last XOR gate 402-8 in the XOR chain receives an operating mode input (signal) 408 having, for example, a logical low state or a logical high state. As such, in at least some embodiments, the output 406-8 of the last XOR gate 402-8 is a high logic or low logic value generated based on an Exclusive-OR operation of the operating mode signal 408 and the MSB 404-8 of the input Gray code bit sequence 404.

The output 406 of the first plurality of XOR gates 402, in at least some embodiments, is a binary code bit sequence ($B_{n-1}B_{n-2} \ldots B_1B_0$) 408 representing a binary code value B that is equivalent to the input Gray code value G. In at least some embodiments, when the operating mode signal 408 has a logical low (0) state, the binary code bit sequence 406 remains in an original state resulting in the input Gray code value G being incremented. However, when the operating mode signal 408 has a logical high (1) state, the binary code bit sequence 406 is inverted, resulting in the input Gray code value G being decremented. The relationship between the XOR gates 402 and their inputs/outputs in FIGS. 4 and 5 can be represented as follows:

For increment (inc=0, the XOR-ed result does not change as a^0=a):
bin[7]=gray_in[7];
bin[6]=gray_in[7]^gray_in[6]=^gray_in[7:6];
bin[5]=gray_in[7]&gray_in[6]^gray_in[5]=^gray_in[7:5];
. . .
bin[0]=^gray_in[7:0].

For decrement (inc=1, the XOR-ed result is inverted since a^1=! a):
bin[7]=! gray_in[7];
bin[6]=! (gray_in[7]^gray_in[6])=!^gray_in[7:6];
bin[5]=! (gray_in[7]&gray_in[6]^gray_in[5])=!^gray_in[7:5];
. . .
bin[0]=!^gray_in[7:0], where gray_in[i] is the input Gray code sequence bit and bin[i] is the equivalent binary code sequence bit.

In at least some embodiments, the circuit design 400 further comprises a first plurality of AND gates 410 and a second plurality of AND gates 412, which correspond to the second operational stage 106-2 of the counter 100 discussed above with respect to FIGS. 1-3. A first input of each AND gate 410, except for the first AND gate 410-1 located at the bottom of the chain in FIG. 5, is coupled to the output 414 of an immediately previous AND gate 410 in the chain. The first input of the AND gate 410-1 is coupled to output 406-1 of the first XOR gate 402-1. The second input of each AND gate 410 is coupled to the output 406 (bin[i]) of an XOR gate 402 in the first plurality of XOR gates 402. As such, the relationship between the AND gates 410 and their inputs/outputs in FIGS. 4 and 5 can be represented as follows:

band[6:0] generation, the AND-chain receives the bit-AND of bin[7:0]:

band[0]=bin[0];

band[1]=bin[1] & bin[0]=& bin[1:0];

band[2]=bin[2] & bin[1] & bin[0]=& bin[2:0];

. . .

band[6]=& bin[6:0], where band[i] is the output of an AND gate 410 in the first plurality of AND gates, except for band[0], which is equal to the output (bin[0]) of the first XOR gate 402-1. Due to the cyclic feature of gray code, the MSB transits when all bits in the binary code bit sequence 406 are all logic high (11111111). Since, in at least some embodiments, the bit index pattern is (01 . . . 1), the binary code bit sequence 406 can be compared against only the lower-bits (1 . . . 1) of the pattern (01 . . . 1) after Boolean optimization. Therefore, in at least some embodiments, an AND gate 410 is not needed to generate band[7] since only the less-significant bits (e.g., the less significant 7-bits in an 8-bit example) can be used to determine when the MSB is to transit.

The first input of each AND gate 412 of the second plurality of AND gates, except for the first AND gate 412-1 located at the bottom of the second chain in FIG. 5, is coupled to the output 414 of one of the AND gates 410 in the first plurality of AND gates. The first input of the first AND gate 412-1 is coupled to the output 406-1 (bin[1]=band[1]) of the first XOR gate 402-1 of the first plurality of XOR gates 402. The second input of each AND gate 412 is inverted and coupled to the output 406 (bin[i]) of one XOR gate 402 of the first plurality of XOR gates 402. As such, in at least some embodiments, each output bit 414 (band[i]) of the first plurality of AND gates 410 is AND-ed with the inverted value of the output 406 (bin[1]) of a more significant XOR gate 402 of the first plurality of XOR gates.

The output 416 of each AND gate 412, in at least some embodiments, is a bit index idx[i] used to determine which bit of the input Gray code bit sequence 404 to change for incrementing or decrementing the input Gray code value G. For example, the combination of the first plurality of AND gates 410 and the second plurality of AND gates 412 compares the binary code bit sequence 406 generated by the first plurality of XOR gates 402 to the bit index pattern (01 . . . 1) to determine which bit of the input Gray code bit sequence 404 to change for incrementing or decrementing the input Gray code value G, as described above with respect to blocks 216 to 226 of FIGS. 2 and 3. The output 416 (idx[i]) of the second plurality of AND gates 412 having a specified logical high value, such as a logical 1, identifies the bit in the input Gray code bit sequence 404 to change. As such, the relationship between the AND gates 412 of the second plurality of AND gates and their inputs/outputs in FIGS. 4 and 5 can be represented as follows:

idx[0]=!band[0]; which means bin[0]=1'b0;

idx[1]=!bin[1] & band[0]; which means bin[1:0]=2'b01;

idx[2]=!bin[2] & band[1]; which means bin[2:0]=3'b011;

idx[3]=!bin[3] & band[2]; which means bin[3:0]= 4'b0111;

. . .

idx[6]=!bin[6] & band[5]; which means bin[6:0]= 7'b011_1111;

idx[7]=band[6]; which means bin[6:0]=7'b111_1111, where idx[i] is the output 416 of the AND gates 412 of the second plurality of AND gates except for idx[0], which is equal to the inverted value of first XOR gate 402-1 output 406-1, and idx[7], which is equal to the output 414-6 (band[6]) of the last AND gate 410-6 of the first plurality of AND gates. Also, the cyclic feature of Gray code causes the MSB of the Gray code bit sequence 404 to change if all the less significant bits are 11 . . . 1. This property is represented in FIGS. 4 and 5 by the absence of an inverter before the MSB AND gate 410-6.

The circuit design 400, in at least some embodiments, further comprises a second plurality of XOR gates 418 corresponding to the third operational stage 106-4 of the counter 100 discussed above with respect to FIGS. 1-3. The first input of each XOR gate 418, except for the first XOR gate 418-1 and the last XOR gate 418-8, is coupled to the output 416 (idx[i]) of one AND gate 412 of the second plurality of AND gates. The first input of the first XOR gate 418-1 is coupled to the output 406-1 (bin[0]=band[0]) of the first XOR gate 402-1 of the first plurality of XOR gates. However, the output 406-1 of the first XOR gate 402-1 is inverted by an inverter 420 prior to being received as an input by the first input of the first XOR gate 418-1. The first input of the last XOR gate 418-8 is coupled to the output 414-6 (band[6]) of the last AND gate 410-6 of the first plurality of AND gates. The second input of each XOR gate 418 is coupled to the first input of a corresponding XOR gate 402 of the first plurality of XOR gates such that the second input of each XOR gate 418 receives a given bit of the input Gray code bit sequence G 404. In at least some embodiments, the XOR gates 418 of the second plurality of XOR gates 418 can each be replaced by a 2:1 MUX. In these embodiments, the first input of the MUX is coupled to the input Gray code bit sequence G 404 and the second input of the MUX is coupled to the inverted version of the input Gray code bit sequence G 404. The selection of each MUX is coupled to the output 416 (idx[i]) of one AND gate of the second plurality of AND gates 412.

As such, in at least some embodiments, the output 422 of each XOR gate 418, except for the first XOR gate 416-1 and last XOR gate 420-8, is a high logic or low value generated based on an Exclusive-OR operation of the output 416 from one of the AND gates 412 of the second plurality of AND gates and a bit from the input Gray code bit sequence 404. The output 422-1 of the first XOR gate 418-1 is a high logic or low value generated based on an Exclusive-OR operation of the inverted output 406-1 from the first XOR gate 402-1 of the first plurality of XOR gates and the LSB 404-1 from the input Gray code bit sequence 404. The output 422-8 of the last XOR gate 418-8 is a high logic or low value generated based on an Exclusive-OR operation of the output 414-6 from the last AND gate 410-6 of the first plurality of AND gates and the MSB 404-8 from the input Gray code bit sequence 404. As such, in at least some embodiments, after each idx[7:0] output/signal is obtained, the idx[7:0] signals are XOR-ed by the second plurality of XOR gates 418 with the corresponding input Gray code bit sequence gray_in[7:0] signal. A signal is inverted if the signal was XOR-ed with 1, i.e., a^1=!a. Therefore, the output of an XOR gate 418 of the second plurality of XOR gates is inverted if the idx bit is 1. Otherwise, the XOR gate output does change.

In at least some embodiments, the output 422 of each XOR gate 418 of the second plurality of XOR gates is coupled to the input of a Flip-Flop 424. For example, the output 422 of the XOR gates 418 is coupled to the D-pin of a D Flip-Flip. The value stored in the Flip-Flop 424 by the XOR gates 418 is sampled by a clock 426 to generate one or more output 428 signals comprising a sequence of gray out[i] bits ($G'_{n-1}G'_{n-2} \ldots G'_1G'_0$) representing an incremented or decremented Gray code value G'. In some embodiments, if the gray out[i] output 428 is directly coupled to the input sequence of Gray code bits (gray in) 404, the counter design 400 is for a continuous Gray code counter.

It should be understood the counter 100 is not limited to the circuit design 400 of FIGS. 4 ad 5 and can be implemented utilizing different designs as well. For example, the circuit design 400 of FIGS. 4 and 5 can be modified by replacing the first plurality of AND gates 410 with a plurality of OR gates. In this configuration, the second input of the last XOR gate 402-8 of the first plurality of XOR gates 402, which is coupled to the operating mode input signal 408, is inverted. The first input, and not the second input, of each AND gate of the second plurality of AND gates 412 is inverted and coupled to the output of an OR gate of the plurality of OR gates. Also, the inverter 420 is moved from the first input of the first XOR gate 418-1 of the second plurality of XOR gates 418 to the first input of the last XOR gate 418-8 of the of the second plurality of XOR gates 418. The inverter 420 is also coupled to the output of the last OR gate of the plurality of OR gates, which replaces the last AND gate 410-6 of the first plurality of AND gates 410. In this configuration, the counter 100 utilizes the bit index pattern (10 . . . 0) as compared to (01 . . . 1).

FIG. 6 shows one example of hardware description language (HDL) code 600 for the circuit design 400 depicted in FIGS. 4 and 5. It should be understood that different HDL code than what is shown in FIG. 6 may be utilized to represent the circuit design 400 of FIGS. 4 and 5. Lines 1 to 7 of the HDL code 600 are directed to conversion of the Gray code to an equivalent binary code. Lines 9 to 19 of the HDL code 600 are directed to identifying the bit index for determining which bit of the input Gray code to change for incrementing or decrementing the Gray code. Lines 21 and 22 are directed to setting the bit index when the MSB of the Gray code is to change. Lines 24 to 35 are directed to incrementing or decrementing the Gray code based on the identified bit index. Electronic design automation (EDA) synthesizing tools can utilize the HDL 600 to obtain various results.

Figure 7:
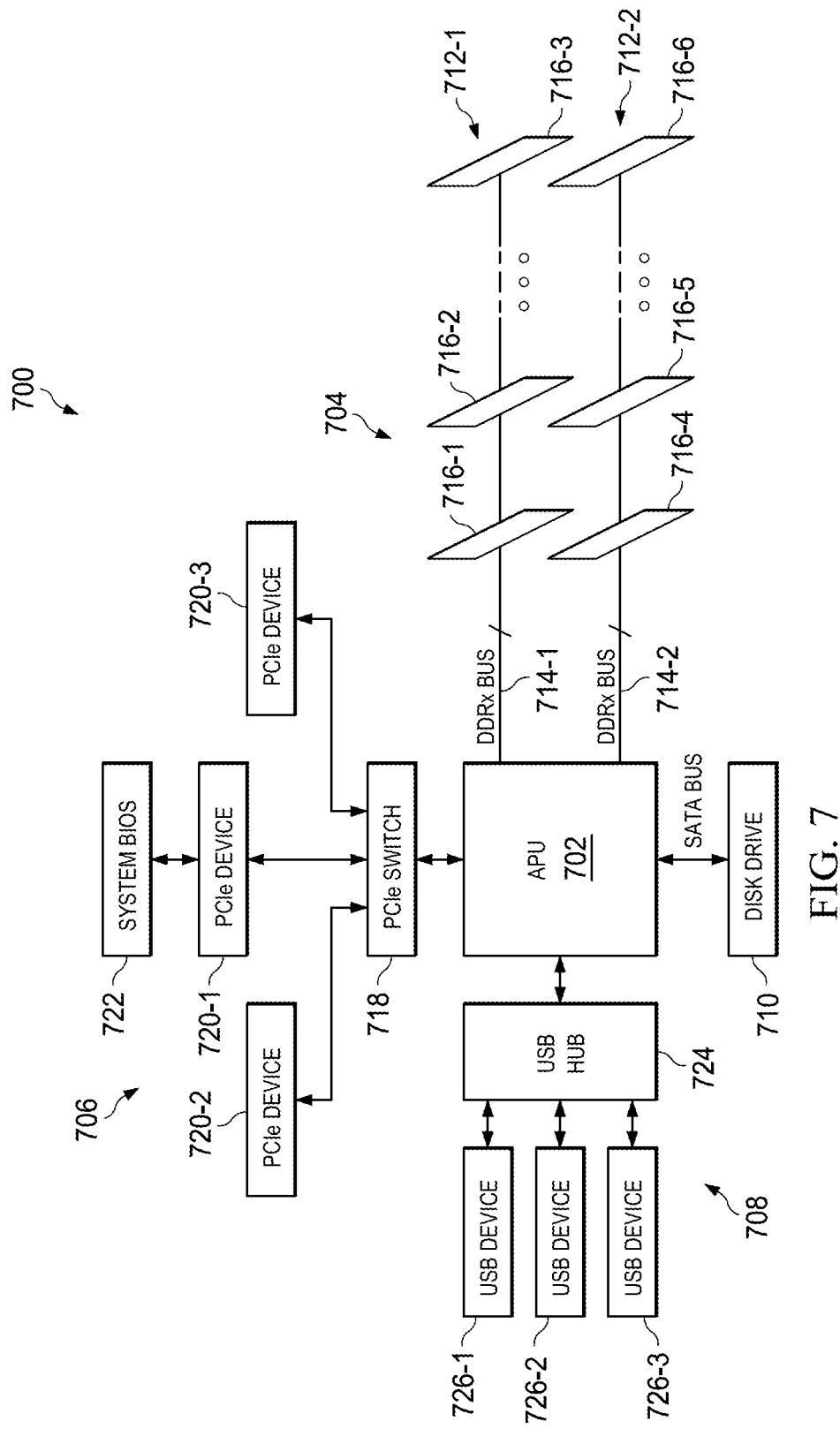
FIG. 7 is a block diagram illustrating a hardware configuration of an electronic device in accordance with some embodiments.

FIG. 7 illustrates an example of an electronic device 700, such as a data processing system, capable of implementing the bi-directional Gray code counter 100 according to some embodiments. In at least some embodiment, the electronic device 700 generally includes a data processor 702 in the form of an accelerated processing unit (APU), a memory system 704, a peripheral component interconnect express (PCIe) system 706, a universal serial bus (USB) system 708, and a disk drive 710. The data processor 702 operates as the central processing unit (CPU) of the electronic device 700 and provides various buses and interfaces useful in modern computer systems. These interfaces include, for example, two double data rate (DDRx) memory channels, a PCIe root complex for connection to a PCIe link, a USB controller for connection to a USB network, and an interface to a Serial Advanced Technology Attachment (SATA) mass storage device. The data processor 702 can also include parallel processors such as vector processors, graphics processing units (GPUs), general-purpose GPUs (GPGPUs), non-scalar processors, highly parallel processors, artificial intelligence (AI) processors, inference engines, machine learning processors, other multithreaded processing units, and the like. In at least some embodiments, the data processor 702 comprises the bi-directional Gray code counter 100. However, the bi-directional Gray code counter 100 can also be implemented in other components of the electronic device 700 or as a separate hardware component.

The memory system 704, in at least some embodiments, includes one or more memory channels 712. Each memory channel 712-1, 712-2 includes, for example, a set of dual inline memory modules (DIMMs) connected to a DDRx bus 714, including representative DIMMs 716 that, in this example, correspond to separate ranks. The PCIe system 706, in at least some embodiments, includes a PCIe switch 718 connected to the PCIe root complex in the data processor 702, and one or more PCI devices 720. At least one of the PCI devices 720-1 is connected to a system basic input/output system (BIOS) memory 722. The System BIOS memory 722 can be any of a variety of non-volatile memory types, such as read-only memory (ROM), flash electrically erasable programmable ROM (EEPROM), and the like.

The USB system 708, in at least some embodiments, comprises a USB hub 724 connected to a USB master in the data processor 702, and representative USB devices 726 each connected to the USB hub 724. The USB devices 726 can be devices such as a keyboard, a mouse, a flash EEPROM port, and the like. The disk drive 710, in at least some embodiments, is connected to the data processor 702 over, for example, a SATA bus and provides mass storage for the operating system, application programs, application files, and the like.

The electronic device 700 is suitable for use in modern computing applications by providing the one or more memory channels 712. Each of the memory channels 712 can connect to state-of-the-art DDR memories such as DDR version four (DDR4), low power DDR4 (LPDDR4), graphics DDR version five (GDDR5), and high bandwidth memory (HBM), and can be adapted for future memory technologies. These memories provide high bus bandwidth and high-speed operation. At the same time, the memories also provide low power modes to save power for battery-powered applications such as laptop computers and also provide built-in thermal monitoring.

Figure 8:
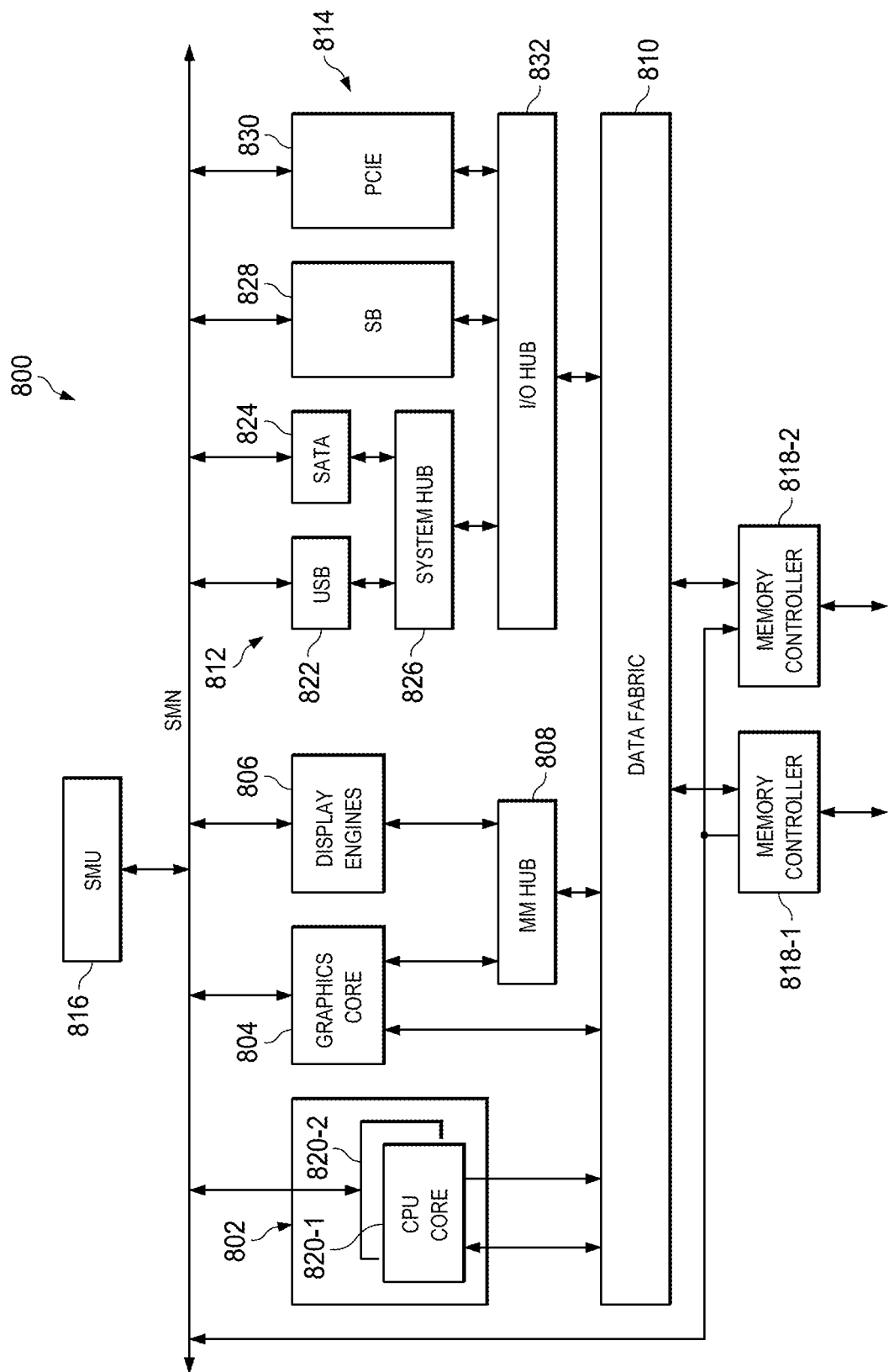
FIG. 8 is a block diagram illustrating a hardware configuration of a processing unit for the electronic device of FIG. 7 in accordance with some embodiments.

FIG. 8 illustrates an example of an APU 800 for use in the electronic device 700 of FIG. 7 and capable of implementing the bi-directional Gray code counter 100 according to some embodiments. In at least some embodiments, the APU 800 generally includes a central processing unit (CPU) core complex 802, a graphics core 804, a set of display engines 806, a memory management hub 808, a data fabric 810, a set of peripheral controllers 812, a set of peripheral bus controllers 814, a system management unit (SMU) 816, and a set of memory controllers 818.

The CPU core complex 802, in at least some embodiments, comprises one or more CPU cores 820. In this example, the CPU core complex 802 includes two CPU cores 820-1, 820-2, but in other embodiments, the CPU core complex 802 can include an arbitrary number of CPU cores. Each of CPU cores 820-1, 820-2 is bidirectionally connected to a system management network (SMN), which forms a control fabric, and to data fabric 810, and is capable of providing memory access requests to data fabric 810. Each of the CPU cores 820-1, 820-2 can be unitary cores, or may further be a core complex with two or more unitary cores sharing certain resources such as caches.

The graphics core 804, in at least some embodiments, is a high-performance graphics processing unit (GPU) capable of performing graphics operations such as vertex processing, fragment processing, shading, texture blending, and the like in a highly integrated and parallel fashion. The graphics core 804 is bidirectionally connected to the SMN and data fabric 810 and is capable of providing memory access requests to data fabric 810. In this regard, the APU 800 can either support a unified memory architecture in which CPU core complex 802 and graphics core 804 share the same memory space or a memory architecture in which CPU core complex 802 and graphics core 804 share a portion of the memory space, while the graphics core 804 also uses a private graphics memory not accessible by the CPU core complex 802.

The display engines 806, in at least some embodiments, render and rasterize objects generated by the graphics core 804 for display on a monitor. The graphics core 804 and display engines 806 are bidirectionally connected to a common memory management hub 808 for uniform translation into appropriate addresses in memory system 704. The memory management hub 808 is bidirectionally connected to data fabric 810 for generating such memory accesses and receiving read data returned from the memory system. The data fabric 810, in at least some embodiments, comprises a crossbar switch for routing memory access requests and memory responses between any memory accessing agent and memory controllers 818. The data fabric 810 also includes a system memory map, defined by BIOS, for determining destinations of memory accesses based on the system configuration, as well as buffers for each virtual connection.

The peripheral controllers 812 include a USB controller 822 and a SATA interface controller 824, each of which is bidirectionally connected to a system hub 826 and the SMN bus. These two controllers 822, 824 are merely exemplary of peripheral controllers that may be used in the APU 800. The peripheral bus controllers 814, in at least some embodiments, comprise a system controller or "Southbridge" (SB) 828 and a PCIe controller 830, each of which is bidirectionally connected to an input/output (I/O) hub 832 and the SMN bus. The I/O hub 832 is also bidirectionally connected to system hub 826 and data fabric 810. Thus, for example, a CPU core can program registers in USB controller 822, SATA interface controller 824, SB 828, or PCIe controller 830 through accesses that data fabric 810 routes through I/O hub 832.

The SMU 816, in at least one embodiment, is a local controller that controls the operation of the resources on the APU 800 and synchronizes communication among them. The SMU 816 manages power-up sequencing of the various processors on the APU 800 and controls multiple off-chip devices via reset, enable, and other signals. The SMU 816 comprises one or more clock sources not shown in FIG. 8, such as a phase-locked loop (PLL) to provide clock signals for each of the components of the APU 800, including the bi-directional Gray code counter 100. The SMU 816 also manages power for the various processors and other functional blocks and can receive measured power consumption values from the CPU cores 820-1, 820-2, and graphics core 804 to determine appropriate power states.

In some embodiments, the apparatus and techniques described above are implemented in a system including one or more integrated circuit (IC) devices (also referred to as integrated circuit packages or microchips), such as the bi-directional Gray code counter 100 described above with reference to FIGS. 1-4. Electronic design automation (EDA) and computer-aided design (CAD) software tools may be used in the design and fabrication of these IC devices. These design tools typically are represented as one or more software programs. The one or more software programs include code executable by a computer system to manipulate the computer system to operate on code representative of circuitry of one or more IC devices to perform at least a portion of a process to design or adapt a manufacturing system to fabricate the circuitry. This code can include instructions, data, or a combination of instructions and data. The software instructions representing a design tool or fabrication tool typically are stored in a computer-readable storage medium accessible to the computing system. Likewise, the code representative of one or more phases of the design or fabrication of an IC device may be stored in and accessed from the same computer-readable storage medium or a different computer-readable storage medium.

A computer-readable storage medium may include any non-transitory storage medium or combination of non-transitory storage media, accessible by a computer system during use to provide instructions and/or data to the computer system. Such storage media can include, but is not limited to, optical media (e.g., compact disc (CD), digital versatile disc (DVD), Blu-ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer-readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

In some embodiments, certain aspects of the techniques described above may implemented by one or more processors of a processing system executing software. The software includes one or more sets of executable instructions stored or otherwise tangibly embodied on a non-transitory computer-readable storage medium. The software can include the instructions and certain data that, when executed by the one or more processors, manipulate the one or more processors to perform one or more aspects of the techniques described above. The non-transitory computer-readable storage medium can include, for example, a magnetic or optical disk storage device, solid-state storage devices such as Flash memory, a cache, random access memory (RAM), or other non-volatile memory device or devices, and the like. The executable instructions stored on the non-transitory computer-readable storage medium may be in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified, and all such variations are considered within the scope of the disclosed subject matter. Accordingly, the protection sought herein is as set forth in the claims below.

What is claimed is:

1. A method comprising:
   converting a first sequence of bits to a second sequence of bits;
   comparing the second sequence of bits to a bit index pattern;
   responsive to comparing the second sequence of bits to the bit index pattern, transitioning one bit in the first sequence of bits from a first state to a second state to form a third sequence of bits; and
   generating an output comprising the third sequence of bits.

2. The method of claim 1, wherein the first sequence of bits represents a first value, the second sequence of bits represents the first value, and the first sequence of bits represents a second value.

3. The method of claim 1, wherein the first sequence of bits comprises a Gray code format and the second sequence of bits comprises a binary code format equivalent to the Gray code format.

4. The method of claim 1, wherein comparing the second sequence of bits to the bit index pattern comprises:
   determining whether a pattern of bits in the second sequence of bits matches the bit index pattern; and
   responsive to a pattern of bits matching the bit index pattern, selecting a most significant bit of the pattern of bits as a bit index.

5. The method of claim 4, wherein comparing the second sequence of bits to the bit index further comprises:
   determining a bit in the first sequence of bits having a bit position corresponding to a bit position of the bit index; and
   selecting the bit as the one bit that is transitioned from the first state to the second state.

6. The method of claim 4, wherein comparing the second sequence of bits to the bit index further comprises:
   responsive to no pattern of bits in the second sequence of bits matching the bit index pattern, determining whether a least significant bit of the second sequence of bits has a zero-value; and
   responsive to the least significant bit having a zero-value, selecting the least significant bit as the bit index.

7. The method of claim 4, wherein comparing the second sequence of bits to the bit index further comprises:
   responsive to no pattern of bits in the second sequence of bits matching the bit index pattern, determining whether at least all less significant bits of the second sequence of bits have a one-value; and
   responsive to at least all less significant bits having a one-value, selecting the most significant bit as the bit index.

8. The method of claim 1, further comprising:
   receiving an operating mode input;
   determining a state of the operating mode input; and
   responsive to the determined state of the operating mode input, determining that a value represented by the first sequence of bits is to be one of incremented or decremented.

9. The method of claim 8, wherein converting the first sequence of bits to the second sequence of bits comprises:
   inverting the second sequence of bits responsive to determining that the value is to be decremented.

10. A processing unit comprising:
    a bi-directional Gray code counter comprising:
      a first set of logic circuitry to convert the first sequence of bits to a second sequence of bits;
      a second set of logic circuitry to compare the second sequence of bits to a bit index pattern; and
      a third set of logic circuitry to transition one bit in the first sequence of bits from a first state to a second state to form a third sequence of bits responsive to the second set of logic circuitry comparing the second sequence of bits to the bit index pattern.

11. The processing unit of claim 10, wherein the first sequence of bits represents a first value, the second sequence of bits represents the first value, and the first sequence of bits represents a second value.

12. The processing unit of claim 10, wherein the first sequence of bits comprises a Gray code format and the second sequence of bits comprises a binary code format equivalent to the Gray code format.

13. The processing unit of claim 10, wherein to compare the second sequence of bits to the bit index pattern the second set of logic circuitry is further to:
    determine whether a pattern of bits in the second sequence of bits matches the bit index pattern; and
    responsive to a pattern of bits matching the bit index pattern, select a most significant bit of the pattern of bits as a bit index.

14. The processing unit of claim 13, wherein to compare the second sequence of bits to the bit index the second set of logic circuitry is further to:
    determine a bit in the first sequence of bits having a bit position corresponding to a bit position of the bit index; and
    select the bit as the one bit that is transitioned from the first state to the second state.

15. The processing unit of claim 13, wherein to compare the second sequence of bits to the bit index the second set of logic circuitry is further to:
    responsive to no pattern of bits in the second sequence of bits matching the bit index pattern, determine whether a least significant bit of the second sequence of bits has a zero-value; and
    responsive to the least significant bit having a zero-value, select the least significant bit as the bit index.

16. The processing unit of claim 13, wherein to compare the second sequence of bits to the bit index the second set of logic circuitry is further to:
    responsive to no pattern of bits in the second sequence of bits matching the bit index pattern, determine whether at least all less significant bits of the second sequence of bits have a one-value; and responsive to at least all less significant bits having a one-value, select the most significant bit as the bit index.

17. The processing unit of claim 10, wherein the first set of logic circuitry is further to:

receive an operating mode input;

determine a state of the operating mode input; and responsive to the determined state of the operating mode input, determine that a value represented by the first sequence of bits is to be one of incremented or decremented.

18. The processing unit of claim 17, wherein to convert the first sequence of bits to the second sequence of bits the second set of logic circuitry is further to:

invert the second sequence of bits responsive to determining that the value is to be decremented.

19. A bi-directional Gray code counter comprising:

a first set of logic circuitry to convert a first sequence of bits to a second sequence of bits;

a second set of logic circuitry to compare the second sequence of bits to a bit index pattern; and a third set of logic circuitry to transition one bit in the first sequence of bits from a first state to a second state to form a third sequence of bits responsive to the second set of logic circuitry comparing the second sequence of bits to the bit index pattern.

20. The bi-directional Gray code counter of claim 19, wherein the first sequence of bits represents a first value, the second sequence of bits represents the first value, and the first sequence of bits represents a second value.

21. The bi-directional Gray code counter of claim 19, wherein to compare the second sequence of bits to the bit index pattern the second set of logic circuitry is further to:

determine whether a pattern of bits in the second sequence of bits matches the bit index pattern; and responsive to a pattern of bits matching the bit index pattern, select a most significant bit of the pattern of bits as a bit index.

22. The bi-directional Gray code counter of claim 21, wherein to compare the second sequence of bits to the bit index the second set of logic circuitry is further to:

determine a bit in the first sequence of bits having a bit position corresponding to a bit position of the bit index; and select the bit as the one bit that is transitioned from the first state to the second state.

23. The bi-directional Gray code counter of claim 21, wherein to compare the second sequence of bits to the bit index the second set of logic circuitry is further to:

responsive to no pattern of bits in the second sequence of bits matching the bit index pattern, determine that a least significant bit of the second sequence of bits has a zero-value or at least all less significant bits of the second sequence of bits have a one-value;

responsive to the least significant bit having a non-zero value, select the least significant bit as the bit index; and responsive to at least all less significant bits having a one-value, select the most significant bit as the bit index.

24. An electronic device implementing the bi-directional Gray code counter of claim 19.

* * * * *